United States Patent
Min et al.

(10) Patent No.: US 6,620,656 B2
(45) Date of Patent: Sep. 16, 2003

(54) METHOD OF FORMING BODY-TIED SILICON ON INSULATOR SEMICONDUCTOR DEVICE

(75) Inventors: Byoung W. Min, Austin, TX (US); Michael A. Mendicino, Austin, TX (US); Laegu Kang, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/024,916

(22) Filed: Dec. 19, 2001

(65) Prior Publication Data

US 2003/0113959 A1 Jun. 19, 2003

(51) Int. Cl.[7] .............................................. H01L 21/00
(52) U.S. Cl. ....................................... 438/149; 438/286
(58) Field of Search ................................. 438/149–155, 438/257–267, 286, 981

(56) References Cited

U.S. PATENT DOCUMENTS

| | | | |
|---|---|---|---|
| 5,012,311 A | | 4/1991 | Shirato |
| 5,422,505 A | | 6/1995 | Shirai |
| 5,576,573 A | | 11/1996 | Su et al. |
| 5,741,737 A | * | 4/1998 | Kachelmeier ............... 438/286 |
| 5,918,133 A | | 6/1999 | Gardner et al. |
| 6,110,783 A | | 8/2000 | Burr |
| 6,133,608 A | | 10/2000 | Flaker, deceased et al. |
| 6,399,448 B1 | * | 6/2002 | Mukhopadhyay et al. .. 438/275 |

FOREIGN PATENT DOCUMENTS

| | | |
|---|---|---|
| EP | 0989613 A1 | 3/2000 |
| GB | 2360874 A | 10/2001 |

OTHER PUBLICATIONS

Mishel Matloubian, "Smart Body Contact for SOI MOSFETs", pp. 128–129.

Ji–Woon Yang et al., "Hot–Carrier Degradation Behavior In Body–Contacted SOI nMOSFETs", Proceedings 1997 IEEE International SOI Conference, Oct. 1997, pp. 38–39; and 64Mbit SOI–DRAM Technologies Using Body–Contacted (BC) Structure, pp. 170–171.

W. Chen et al., "Suppression of the SOI Floating–body Effects by Linked–body Device Structure", 1996 Symposium on VLSI Technology Digest of Technical Papers, Section 10.1, pp. 92–93.

M. Patel et al., "A Novel Body Contact For SIMOX Based SOI MOSFETs", 1991 Pergamon Press, 1991 Solid–State Electronics, vol.34,No. 10, pp. 1071–1075.

(List continued on next page.)

*Primary Examiner*—Jey Tsai
(74) *Attorney, Agent, or Firm*—Kim-Marie Vo; James L. Clingan, Jr.

(57) ABSTRACT

An integrated circuit using silicon-on-insulator (SOI) has most of its transistors with their channels (bodies) floating. Some of the transistors, however, must have their channels coupled to a predetermined bias in order to achieve desired operating characteristics. In order to achieve the needed bias, a contact path is provided in the semiconductor layer of the SOI substrate and under an extension of the gate of the transistor. The extension is separated from the semiconductor layer by an insulator that is thicker than that for most of the transistor but advantageously is the same as that used for some of the thick gate insulator devices used, typically, for high voltage applications. This thicker insulator advantageously reduces the capacitance, but does not increase process complexity because it uses an insulator already required by the process.

18 Claims, 7 Drawing Sheets

OTHER PUBLICATIONS

Stephen C. Kuehne et al., "Deep Sub–Micron SOI MOSFET With Buried Body Strap", Proceedings Oct. 1996 IEEE International SOI Conference, pp. 96–97.

Won–Gu Kang et al., "Grounded Body SOI(BGSOI) nMOS-FET by Wafer Bonding", Jan., 1995 IEEE Electron Device Letters, vol. 16, No.1, pp. 1–4.

Wayne E. Bailey, "Silicon–On–Insulator Technology and Devices", Electronics and Dielectrics and Insulation Divisions Proceedings, vol. 92–13, pp. 64–70.

PCT International Search Report.

* cited by examiner

METHOD OF FORMING BODY-TIED SILICON ON INSULATOR SEMICONDUCTOR DEVICE

RELATED APPLICATION

The present invention relates to a application entitled "Body-Tied Silicon on Insulator Semiconductor Device Structure and Method Therefor" which was filed on Sep. 19, 2000 and has a Ser. No. of 09/665,550 and is assigned to the same assignee as the present application.

FIELD OF THE INVENTION

The invention related generally to semiconductor devices and more particularly to a body-tied silicon-on-insulator semiconductor device structure and method therefore.

RELATED ART

Silicon on insulator (SOI) technology has been developed to provide a number of advantages over bulk silicon device technologies. As is known, SOI provides improvements in speed and power consumption with respect to previous bulk silicon circuits. Some of the benefits of SOI technology are based on the reduced capacitance at various junctions within semiconductor devices, whereas additional benefits are derived from the floating body itself.

Because the speed with which a floating body device switches may be affected by the previous state of the device, undesirable variations in switching speed may occur. Therefore, although floating body coupling can provide advantages for some portion of the circuit built using SOI technology, in some cases a known body potential for specific devices is desired. As such, knowledge of the potential of the body in a body-tied SOI device ensures that the switching characteristics of the device are reproducible and predictable regardless of the previous state of the device.

In order to allow for body-tied devices within SOI circuits, some device structures have been developed that provide a means for tying the active area of individual devices to a known potential. Examples include T-and H-gate transistor structures where the active area extends beyond the gate structure to provide a means for supplying the desired potential to the active area. The T-and H-gate structures have a significant amount of added gate capacitance and are also problematic in terms of process control issues. As a result of the additional gate capacitance, significant reduction of device speed can occur when T-and H-gate structures are used.

In other prior art techniques for controlling the potential within active areas in SOI devices, a uniform biasing potential may be applied to all of the devices in a well by linking the bodies of these devices underneath the field oxide. Although this does ensure that the potential within the bodies of the transistors is known, it does not allow devices that have known body potential to coexist with floating body devices. Thus, as floating body devices are desirable for some portions of the circuit and whereas body-tied devices are desirable for other portions of the circuit, such techniques are hindered by undesirable limitations. Furthermore, by linking the bodies of the transistors within the well structure, some of the isolation advantages provided by SOI technology are forfeited. For example, some of the advantages in terms of avoiding latch-up and leakage are diminished.

Therefore, a need exists for a body-tied SOI device that does not suffer from the adverse effects associated with increased gate capacitance and reduced isolation integrity while providing adequate assurance as to active area potential such that the switching characteristics of the device are well understood.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Generally, the present invention provides a silicon-on-insulator (SOI) device structure and method therefore, where the SOI device structure utilizes a dual oxide in order to decrease parasitic gate capacitance between a portion of the gate electrode and a portion of the semiconductor layer. A first potion of the dual oxide serves as a gate oxide for a first transistor. A second portion of the dual oxide, which has a smaller capacitance per unit area than that of the first portion, separates a contact path in the semiconductor layer of the SOI substrate from an extension of the gate electrode. The second portion can be formed simultaneously with the formation of a gate oxide for a high voltage application transistor located in a different area of the substrate. The invention can be better understood with reference to one embodiment shown in FIGS. 1–17. FIGS. 1–9 illustrate the formation of a first semiconductor device 200, which includes a first transistor that can be formed simultaneously with a second semiconductor device 300, which includes a second transistor, illustrated in FIGS. 12–17.

Figure 1:
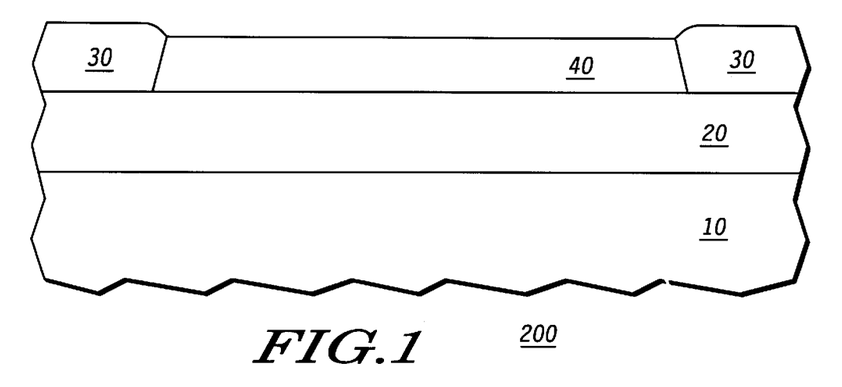
FIGS. 1–9 include illustrations of cross-sectional views of the formation of a portion of a first semiconductor device in accordance with a particular embodiment of the present invention.

FIG. 1 illustrates a cross-sectional view of a portion of the first semiconductor device 200 after forming field oxide regions 30 over an SOI substrate. The SOI substrate includes an underlying substrate 10, a buried insulating layer 20, and a semiconductor layer 40. The underlying substrate 10 may be silicon, sapphire, or other materials that provide adequate mechanical support for the overlying insulating and semi-conducting layers. Silicon may be a preferable material for the underlying substrate 10 due to its desirable thermal and reactive characteristics. The buried insulating layer 20 or buried oxide layer (BOX) is formed on the underlying substrate 10. This may be accomplished by implanting oxygen or nitrogen ions within a semiconductive base material (i.e., a P-type monocrystalline silicon wafer) at an energy and a range of approximately 100–200 KeV to a dose of at least $1 \times 10^{16}$ ions per square centimeter and usually on the order of $1 \times 10^{18}$ ions per square centimeter. Heat is typically applied to the semiconductor base material during implantation to maintain crystallinity. The substrate is then annealed at a temperature in a range of approximately 1000°–1200° Celsius for a time within a range of approximately 1–5 hours. These steps form the buried insulating layer 20 and a semiconductor layer 40, which may be a monocrystalline layer, having a thickness less than approximately 2500 Å and more typically in the range of approximately 300–1500 Å. The semiconductor layer 40 includes an active area with a top surface upon which a transistor is formed.

In an alternate embodiment, the substrate of FIG. 1 may be formed by conventional wafer—wafer bonding techniques. In still an alternate embodiment, the semiconductor layer 40 is formed over a sapphire substrate or a substrate of another insulating material that is also capable of providing adequate mechanical support to the overlying silicon layer within which the device formation occurs. Wafer—wafer bonding techniques enable the use of crystalline films other than silicon, such as silicon germanium and silicon carbide.

As shown in FIG. 1, the field oxide regions 30 can be formed by shallow trench isolation by etching the semiconductor layer 40, depositing an insulating material, such as silicon oxide by high density plasma (HDP) deposition, and chemical mechanical polishing (CMP) the insulating layer so that it is substantially coplanar with the semiconductor layer 40. The process may include using state of the art photolithography, stress relief layers, anti-reflection layers, and CMP stop layers as known to one of ordinary skill in the art. In another embodiment, the field oxide regions 30 be formed by performing localized oxidation of silicon (LOCOS).

Note that the figures correspond to the formation of a body-tied N-channel device, or N-metal oxide semiconductor field effect transistor (MOSFET). As such, the body of the NMOS transistor is P-type. Although the semiconductor layer may be very lightly doped due to the crystal growth of the semiconductor material, an ion implantation may be performed in at least portions or active areas of the semiconductor layer 40 to increase the dopants in the semiconductor layer 40 to form a more highly P-doped or an active area 40, which later provides a conductive path to the P-type body.

Figure 12:
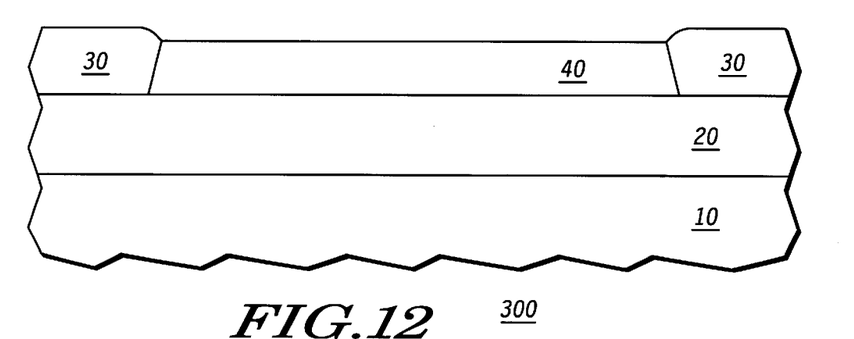
FIGS. 12–18 include illustrations of cross-sectional views of the formation of a portion of a second semiconductor device that can be formed simultaneously with the first semiconductor device in accordance with a particular embodiment of the present invention.

FIG. 12 illustrates a cross-sectional view of a portion of the second semiconductor device 300 formed using the same process sequence above as the first semiconductor device 200 to form the underlying substrate 10, the buried insulating layer 20, the semiconductor layer 40 and the field oxide regions 30. The second semiconductor device 300 can be formed on the same substrate or wafer as the first semiconductor device or wafer 200. As will be described herein, the first semiconductor device 200 and the second semiconductor device 300 are devices on different areas of a semiconductor wafer and therefore will undergo the same processing sequence.

Figure 2:
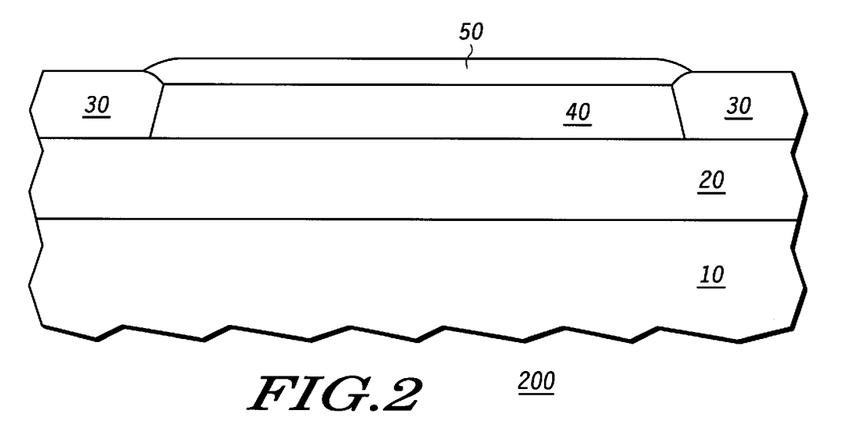
Figure 13:
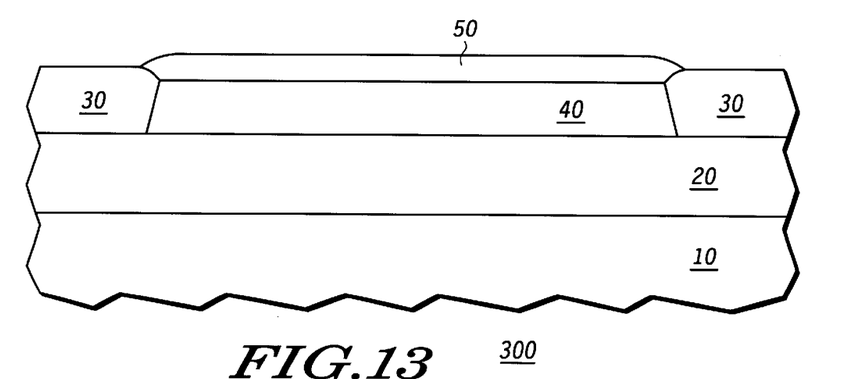

As shown in FIG. 2, after doping the semiconductor layer 40, a thick insulating layer 50 is formed by chemical vapor deposition (CVD), thermal growth or the like, on the top surface of the semiconductor layer 40. Materials for the thick insulating layer 50 include silicon oxide, hafnium oxide, zirconium oxide, aluminum oxide, tantalum pentoxide, any other high dielectric constant material, silicon oxynitrides, silicon nitrides, or any other insulating material. It is desirable that the m material chosen be compatible with the materials chosen for the semiconductor layer 40 and the subsequently formed thin insulating layer and the gate electrode. The thick insulating layer 50 is also grown over the second semiconductor device 300 to form a gate insulator, as shown in FIG. 13.

Figure 3:
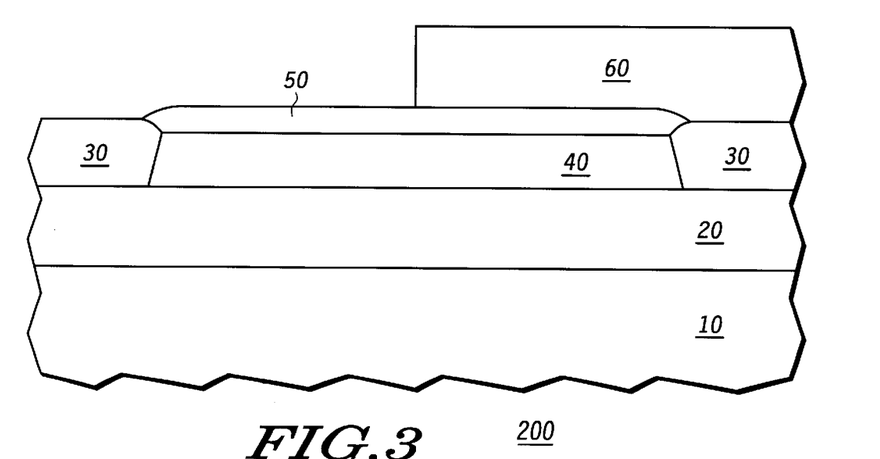
Figure 14:
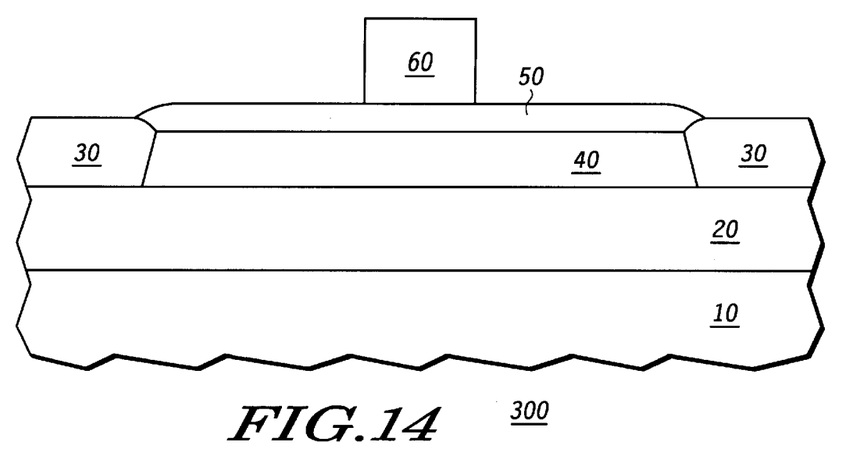

As shown in FIG. 3, after forming the thick insulating layer 50, a first photoresist layer 60 is formed and patterned over the firs semiconductor device 200 to expose a portion of the thick insulating layer 50 over the first semiconductor device 200. As will be better understood later, the exposed portion of the thick insulating layer will be the width of the subsequently formed transistor. The exposed portion of the thick insulating layer 50 is removed by an etch process, which is preferably a wet process using HF to expose a portion of the top surface of semiconductor layer 40. Alternately, a dry etch process can be used. However, the dry etch may result in damage to the semiconductor layer 40. The first photoresist layer 60 is also formed and patterned over the entire structure of the second semiconductor device 300, as shown in FIG. 14.

Figure 4:
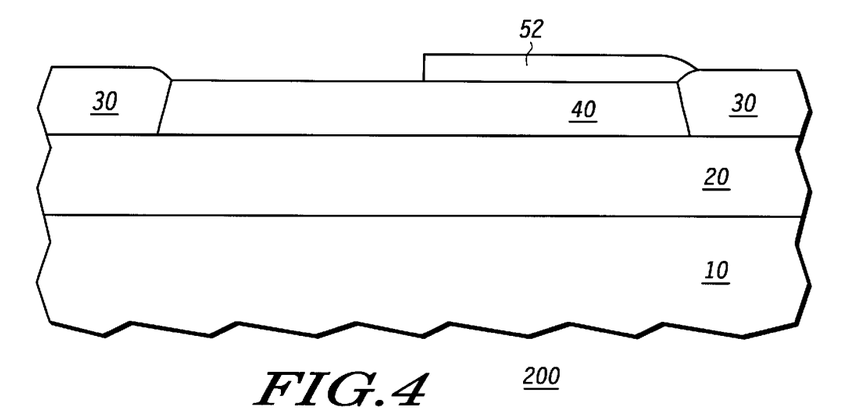
Figure 15:
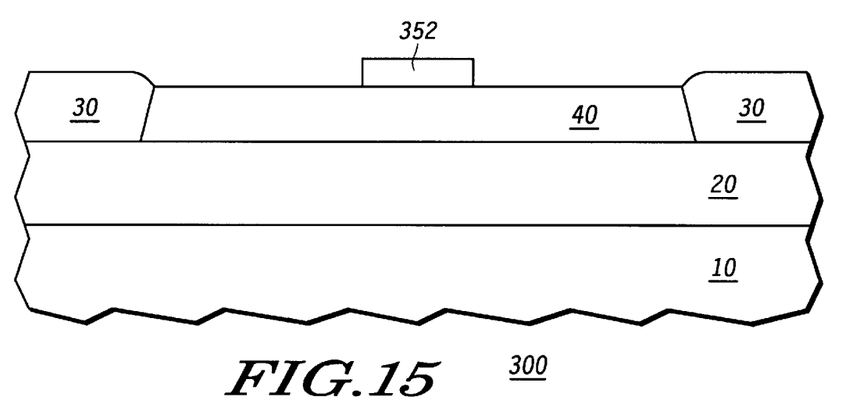

As shown in FIG. 4, after etching the thick insulating layer 50, the first photoresist layer 60 is removed using a conventional process, resulting in a thick insulator 52 over the first semiconductor device 200. The photoresist layer 60 is also removed from the second semiconductor device 300 to expose a thick gate insulator 352, as shown in FIG. 15. After forming the thick insulators 52 and 352, a photoresist layer (not shown) may be formed over the second semiconductor device 300 and patterned to protect the thick gate insulator 352. However, this is not necessary and in the embodiment shown in the figures is not performed.

Figure 5:
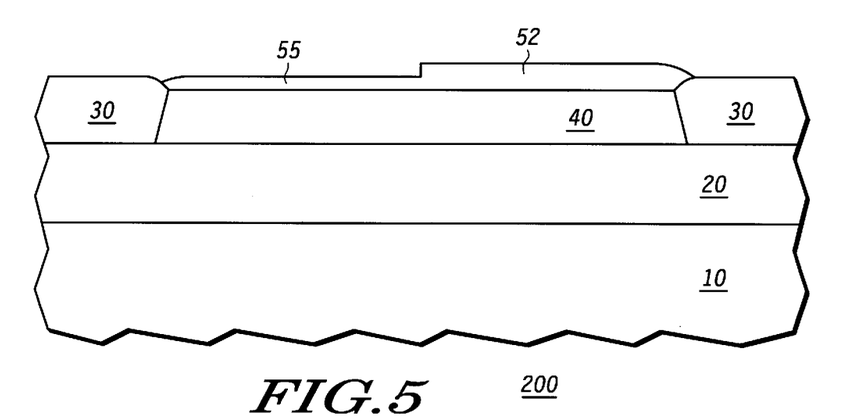

After forming the thick insulator 52, a thin insulator 55 is formed by CVD, atomic layer deposition, thermal growth, or the like over the first portion of semiconductor layer 40. Although FIG. 5 illustrates the transition from thin insulator 55 to thick insulator 52 to be a sharp corner, due to the thinness of both layers and the nature of the processing, the transition is most likely smooth. The thin insulator 55 can be any material described for the thick insulator 52; the thin insulator 55 and the thick insulator 52 may or may not be the same material. Hence, in one embodiment, the thick insulator 52 and the thin insulator 55 may have different dielectric constants and may be substantially the same thickness provided the thick insulator 52 has a smaller capacitance per unit areas than that of the thin insulator 55. Thus, the description of the insulators as thick and thin does not limit the material to being thicker of thinner than each other in all embodiments of the invention. Instead, in all embodiments, the thin insulator 55, regardless of material or thickness, has a smaller capacitance per unit area than the thick insulator 52, regardless of material or thickness. This can be achieved by changing the thickness or altering the dielectric constant of the materials chosen. For example, in the embodiment where the thin insulator 55 and the thick insulator 52 are the same material, the thin insulator 55 is substantially thinner than the thick insulator 52.

In one embodiment, the thick insulator 52 is approximately two times thicker than the thin insulator 55. Generally, the thin insulator 55 is less than 10 nanometers and may typically be in a range of 1–8 nanometers. During the formation of the thin insulator 55, the thick insulator 52 of both the first semiconductor device 200 may increase in thickness because the thick insulator 52 may be exposed to the same growth process as the thin insulator 55. Thus, it is possible for the thick insulator 52 to include two materials. Likewise, the thick insulator 352 of the second semiconductor device 300 may increase in thickness or include two material, if exposed during the processes used to form the thin insulator 55.

After forming the thin insulator 55, a photoresist layer (not shown) is removed using conventional processes a gate electrode layer is formed over the field oxide regions 30, the thin insulator 55 and the thick insulator 52. This may be accomplished by depositing a polycrystalline silicon (polysilicon) or amorphous silicon layer as the gate material layer. The gate material layer may be doped in situ, such that doped material is initially deposited, or doped during a separate operation that occurs following deposition. Typically, the gate electrode layer is formed by CVD and is polysilicon. However, other materials such as silicon germanium, titanium nitride, tungsten, tantalum nitride or any material with desirable work functions can be used. In addition, the gate electrode layer can include a metal.

Figure 6:
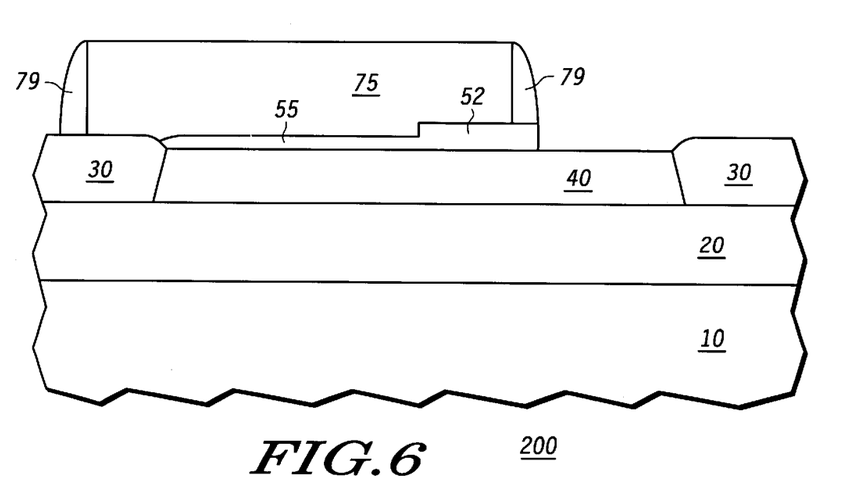

As shown in FIG. 6, after deposition of the gate electrode layer, patterning steps, which may include the use of a photoresist layer, are used in conjunction with etching operations to selectively remove portions of the gate electrode layer resulting in gate electrode (gate conductor) 75. Next, an insulating material, such as silicon nitride, is formed and patterned to form sidewall spacer 79, as shown in FIG. 6. The spacers 79 are formed adjacent to the gate electrode 75 and along the sidewalls of the gate electrode 75 by conformally depositing and anisotropically etching a layer or multiple layers including oxide, nitride or the like. When forming the spacers 79 a portion of the thick insulator 52 may be removed. As a result, the desired gate structure associated with the NMOS device is formed. The same processing results in a gate electrode 375 and spacers 379 of the second semiconductor device 300, shown in FIG. 16.

Figure 7:
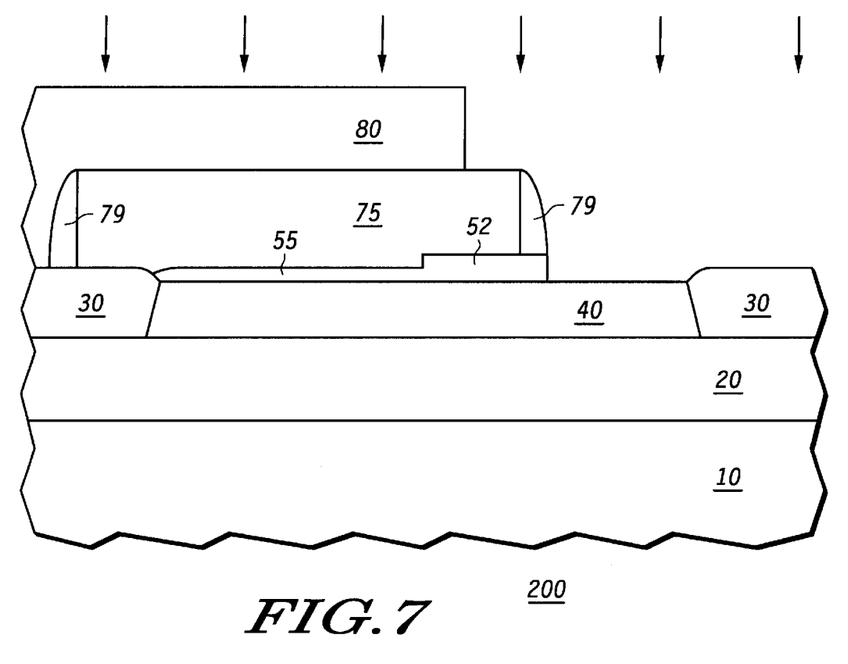

As shown in FIG. 7, after forming the gate electrode 75 and the spacers 79, patterning, which may include the use of a second photoresist layer 80 to protect the second semiconductor device 300 (not shown) and portions of the first semiconductor device 200, is then performed to facilitate a P+implant operation. In one embodiment, boron is implanted at an energy of 5KeV using a dosage of 3.5E15 atoms per centimeter squared. A skilled artisan recognizes that other p-type species and conditions can be used.

Figure 8:
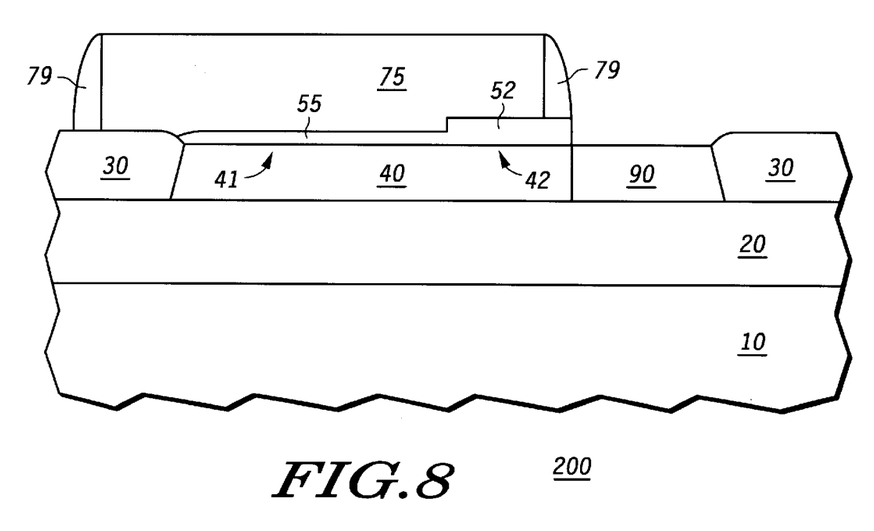
Figure 11:
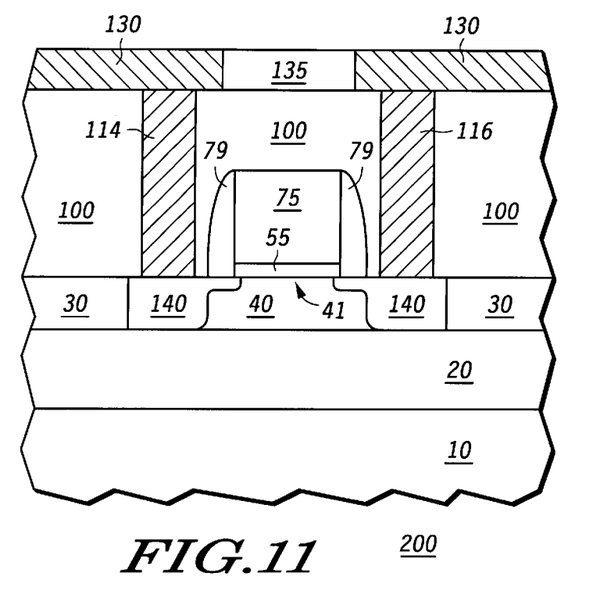
FIG. 11 includes an illustration of an alternate cross-sectional view of the portion of the first semiconductor device of FIG. 10.
Figure 16:
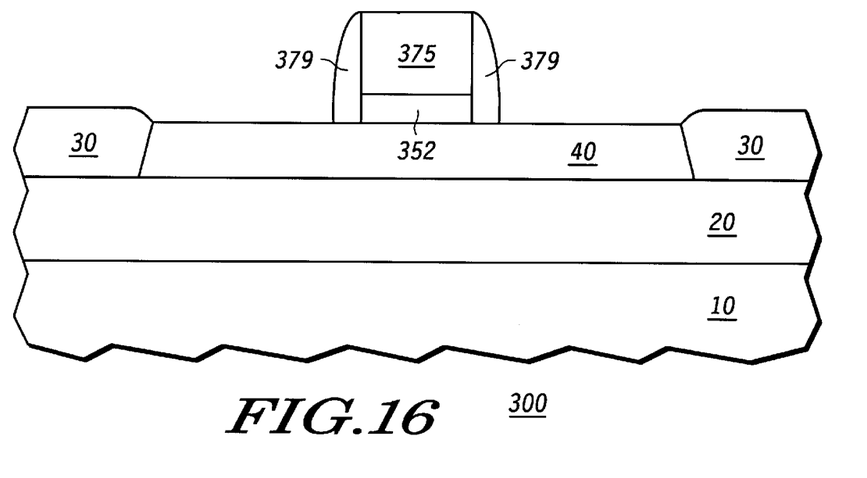
Figure 17:
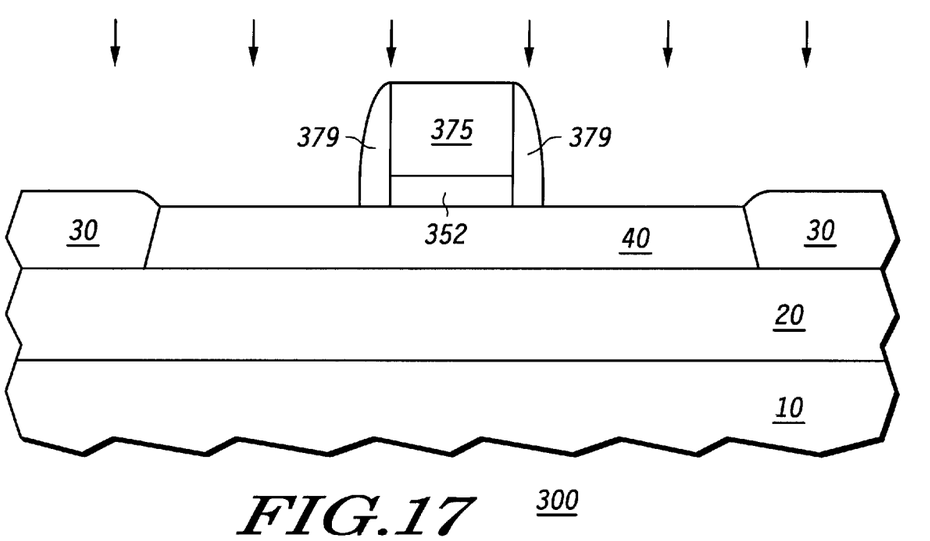

As shown in FIG. 8, the P+implant serves to dope a portion of the semiconductor layer 40, which serves as a (ohmic) body contact 42 for the NMOS device, and form a doped region 90 within the semiconductor layer 40. The same implant operation serves to dope the source regions, drain regions, and the gate electrode for the complementary PMOS device being formed over the first semiconductor device 200 and perpendicular to a portion of the first semiconductor device 200 shown in FIGS. 1–9. Formation of the source and drain regions produces a channel 41 there between, where the channel 41 may also be referred to as the body region 41 of the device. Additionally, a N+implant is performed using a photoresist layer to mask portions of the first semiconductor device 200 to dope the source and drain regions 140 or 340 and the gate electrodes 75 and 375 for the NMOS device of both the first and second semiconductor device 200 and 300, as shown in FIGS. 11 and 16 for the first 200 and second 300 semiconductor devices, respectively. This implant can also be used to dope the body contact region 41 of complementary (PMOS) devices formed on areas of the substrates not shown.

After implanting the second photoresist layer 80 is removed using conventional processes. Cleaning is performed to remove any remaining insulating layers over the doped region 90 of the first semiconductor device 200 and any doped areas of the semiconductor layer 40 of the second semiconductor device 300. Salicide (not shown) may be formed over the doped region 90 of the first semiconductor device 200 and any doped areas of the semiconductor layer 40 of the second semiconductor device 300 to reduce sheet and contact resistance.

Figure 9:
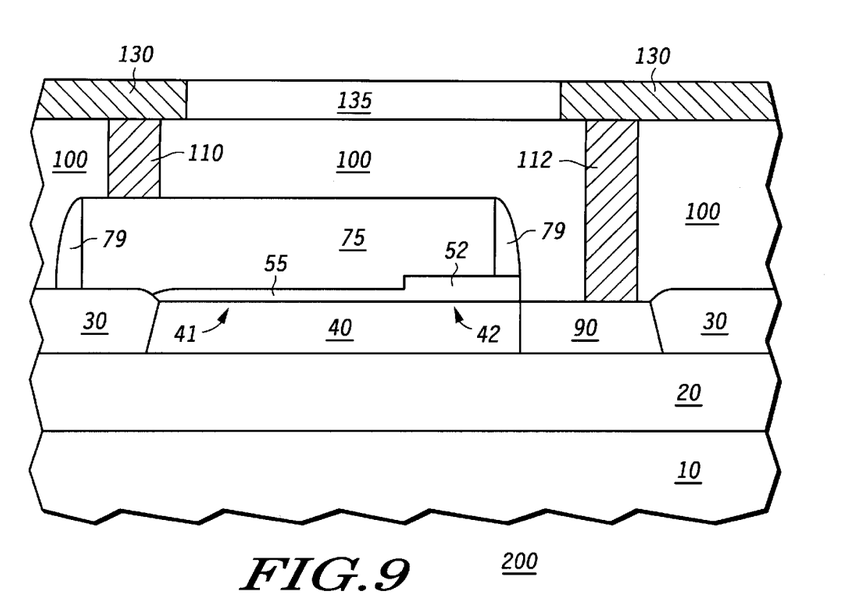

FIG. 9 illustrates a cross-sectional view of the SOI substrate of FIG. 8 following subsequent processing steps associated with completion of the NMOS device and associated interconnects. An interlevel dielectric (ILD) layer 90 is formed overlying the structure of FIG. 8. Subsequent planarization, patterning, and etching provide for a desirable ILD layer 100 that includes contact regions in which contacts 110 and 112, which may be metal, such as tungsten, are formed. Note that formation of regions for additional contacts associated with the source and drain for the NMOS device (illustrated in FIG. 10) also occurs during such patterning and etching operations.

Figure 18:
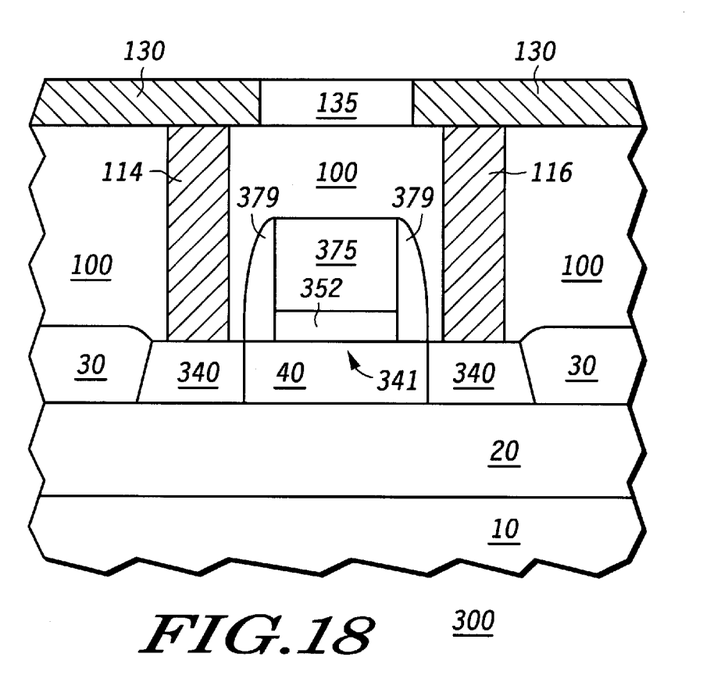

The contact 110 provides access to the gate electrode 75, where the contact 110 may be coupled to a portion of an overlying interconnect layer 130. Similarly, the contact 112 provides a means for coupling the overlying interconnect layer 130 to the body region 40 through the doped region 90. Standard metallization steps are used to form the desired traces in the interconnect layer 130, where these traces are separated by a second ILD 135. As is apparent to one of ordinary skill in the art, additional layers of interconnect can be added to allow for additional wiring capability for the circuit. Although many details of these layers and their deposition and patterning techniques are not described in detail herein, one of ordinary skill in the art appreciates that state of the art techniques (e.g. halo and extension drain engineering, salicides, barrier layers, capping layers, etch stop layers, etc.) may be relied upon in the formation of these layers. The same processes are used to form the source and drain contacts 314 and 316 within the ILD layer 100 underneath the interconnect layer 130 and the second ILD 135 for the second semiconductor device 300, as shown in FIG. 18.

Figure 10:
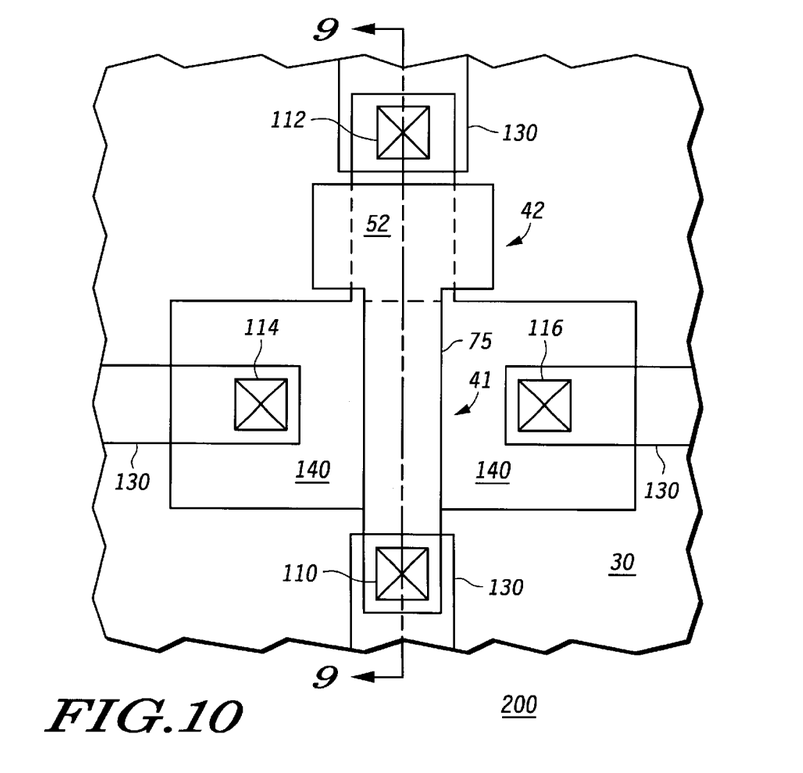
FIG. 10 includes an illustration of a top-down perspective of the portion of the first semiconductor device formed based on the processes illustrated in FIGS. 1–9.

FIG. 10 illustrates a top-down view of the semiconductor device formed using the various steps described with respect to FIGS. 1–9 above. Note that FIGS. 1–9 correspond to a cross-section of the device intersecting contacts 110 and 112 along an axis labeled with the large numeral 9. Features included in the top-down view of FIG. 10 not illustrated in the prior figures include source and drain regions 140, which are preferably doped by the N+implant operations performed after formation of the gate electrode 75. The source and drain contacts 114 and 116 provide connectivity to the source/drain regions 140, and interconnect layer portions 130 facilitate the provision of electrical signals to the source and drain regions 140. As shown in FIG. 10, the gate electrode 75 is substantially T shape, meaning the gate electrode consists of two rectangular portion that are approximately perpendicular to each other, and the thick insulator 52 substantially lies underneath the portion of the gate electrode 175 that is adjacent to the channel 41 of the device and over the body contact 42. This T shape is formed by removing portions of the gate electrode layer as described in regards to FIGS. 6 and 15, from a cross-sectional view. From a top-down view, when patterning the gate electrode layer first, second, and third portions of the gate electrode layer (gate conductor) are removed, wherein the first portion of the gate conductor overlies the thin insulator 55 and a first region 101 in the active area, the second portion of the gate conductor overlies the thin insulator 55 and a second region 102 in the active area, and the third portion of the gate conductor overlies the thick insulator 52 and a third region 103 in the active area. The remaining gate electrode lies between the removed first and second regions and over the thick insulator 55 and a region in an active area. The third region 103 is doped to a higher concentration of the same conductivity type of the transistor as the active area 41 and the first 101 and second 102 regions are doped a different conductivity type than the third region 103. In one embodiment the region under the gate electrode is the same conductivity as the third region. As previously discussed, contacts 112, 1 14, and 116 are formed to the first 101, second 102, and third 103 regions. In order to minimize parasitic capacitance and account for manufacturing limitations, the thick insulator 52 may overlap a small portion of the channel region.

The structure that includes the thick insulator 52, the gate electrode 75 and the body contact region 90 can be repeated at the opposite end of the channel such that the impact of manufacturing variations, such as photolithography misalignment, is decreased. In this embodiment, the gate electrode 75 is substantially H shape, meaning the gate electrode consists of three rectangular portions, wherein the first and second rectangular portions are approximately parallel to each other and are connected to each other by the third rectangular portion, which is approximately perpendicular to the first and second rectangular portions.

FIG. 11 illustraates a top-down view of the device of FIG. 10 taken along a different cross-sectional axis (a line labeled with a numeral 11 in FIG. 10). The cross-sectional view of the device depicted in FIG. 11 does not differ from the cross-sectional view of a conventional floating body device. As is shown, the semiconductor layer 40, which includes the channel region 41 of the device, is positioned between the source and drain regions 140, overlying the buried insulating layer 20 and under the gate insulator 55. The field oxide regions 30 isolate the device on each side form other portions of the semiconductor substrate, including other transistors. Contacts 114 and 116 are isolated from each other by the first ILD 100 and connect to metal layers 530 which are isolated from each other by the second ILD 135, as discussed in regards to FIG. 9.

FIG. 16 illustrates a cross-sectional view of the second semiconductor device 300 shown in FIGS. 12–16. The second transistor shown in FIG. 16 differs from the first-;transistor shown in FIG. 11 in terms of the thickness of the gate insulator. It should be understood by now that the thickness of the second gate insulator 352 is thicker than the first gate insulator 52 because the second gate insulator is formed when forming the insulator 52. (Alternatively, the second gate insulator 352 and the first gate insulator 55 are substantially the same thickness if two different materials are used so that capacitance per unit area of the second gate insulator 352 is greater than that of the first gate insulator 55.) The semiconductor layer 40 includes the second transistor's channel region 341, which is positioned between the source and drain regions 340, overlying the buried insulating layer 20 and below the gate insulator 352. The field oxide regions 30 isolate the device on each side. Contacts 314 and 316, which are separated by first ILD 100, connect to metal layers 130, which are isolated from each other by the second ILD 135.

Other processes may also be added to those described above such as pre-cleans to remove native oxide, which may be performed prior to formation of the thick insulating layer 50 and the thin insulator 55, and sacrificial oxidations. In addition, alternative processing sequences can be used. For example, the exposed thick insulator 52 can be removed during gate electrode etch, spacer formation, or cleaning processes prior to salicidation.

In another embodiment, the thin insulator 55 and the thick insulator 52 can be formed by other processing sequences, such as differential oxidations. Differential oxidations can be accomplished by retarding growth of the thin oxide by doping the semiconductor layer 40 with nitrogen or another suitable species or accelerating growth of the thick oxide by doping the semiconductor layer 40 with fluorine, argon, or another suitable species.

In a typical SOI circuit, it may only be desirable to include a limited number of body-tied devices. For example, the percentage of devices on the circuit that are a body-tied device as opposed to a floating-body device may be on the order of 5–10%. In other embodiments, even fewer body-tied devices may be required. As such, the mask associated with patterning the first photoresist layer 60 for forming the thick insulator 52 may be such that the density of patterned area is relatively low.

It should be appreciated by now that the described process and structure reduces parasitic capacitance, provides or enables a known or fixed body potential and decreases body resistance under the thick insulator 52 at elevated gate bias. Since current technology typically utilizes the simultaneous formation of transistors with various gate insulator thicknesses, the formation of two different insulators for the first semiconductor device 200 does not add any process complexity or cost.

The figures, and accompanying text describe the formation of an NMOS transistor. As is apparent to one of ordinary skill in the art, similar procedures using dopant materials of opposing conductivity (i.e. P+doping for source/drain, N+doping for the conductive body region, etc.) can be used to form PMOS transistors that provide the biasing advantages for SOI devices without the added gate capacitance and other detrimental side effects associated with prior-art body-tied devices.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of making a semiconductor device, comprising:
    providing a substrate having a semiconductor layer and an insulating layer, wherein the semiconductor layer overlies the insulating layer and comprises an active area with a top surface;

doping the active area to a first conductivity type;

forming a first gate insulating layer on the top surface;

etching a portion of the first gate insulating layer to expose a first portion of the top surface;

forming a second gate insulating over the first portion of the top surface, wherein the second gate insulating layer is thinner than the first gate insulating layer;

forming a gate conductor over the first gate insulating layer and over the second gate insulating layer;

removing first, second, and third portions of the gate conductor, wherein the first portion of the gate conductor overlies the second gate insulating layer and a first region in the active area, the second portion of the gate conductor overlies the second gate insulating layer and a second region in the active area, and the third portion of the gate conductor overlies the first gate insulating layer and a third region in the active area;

doping the third region to a higher concentration of the first conductivity type;

doping the first region and the second regions to a second conductivity type; and forming contacts to the first, second, and third regions.

2. The method of claim 1, wherein removing further comprises leaving a fourth portion of the gate conductor between the first and second portions, wherein the fourth portion is over the second gate insulating layer and a fourth region in the active area.

3. The method of claim 2, wherein the fourth region is characterized as being the first conductivity type.

4. The method of claim 3, wherein the fourth region comprises a channel region, the fourth portion of the gate conductor comprises a gate, and the first region comprises a source, and the second region comprises a drain.

5. The method of claim 1, wherein the gate conductor comprises a material selected from the group consisting of: polysilicon, germanium, titanium, tungsten and tantalum nitride.

6. The method of claim 1, wherein the first gate insulating layer comprises silicon oxide.

7. The method of claim 1, wherein the second gate insulating layer comprises a material selected from hafnium oxide, silicon oxide, silicon nitride, zirconium oxide, aluminum oxide, and tantalum pentoxide.

8. The method of claim 1, wherein the first gate insulating layer is at least about twice as thick as the second gate insulating layer.

9. The method of claim 1, wherein the substrate has a second active area, wherein:

doping the active area further comprises doping the second active area to the first conductivity type;

forming a first gate insulating layer further comprises forming the first gate insulating layer over the second active area;

removing further comprises removing a fourth portion and a fifth portion of the of the gate conductor and leaving a sixth portion of the gate conductor, wherein the fourth portion of the gate conductor overlies a fourth region, said fourth region in the second active area, wherein the fifth portion of the gate conductor overlies a fifth region, said fifth region in the second active area, and wherein the sixth portion is between the fourth and fifth regions, overlies a sixth region, and is separated from the sixth region by the first gate insulating layer, said sixth region in the second active area and doped to the first conductivity type;

doping the first region and the second region further comprises doping the fourth and fifth regions to the second conductivity type using the sixth portion as a mask; and forming contacts further comprises forming contacts to the fourth and fifth regions.

10. A method of making a semiconductor device, comprising:

providing a substrate having a semiconductor layer and an insulating layer, wherein the semiconductor layer overlies the insulating layer and comprises an active area with a top surface;

doping the active area to a first conductivity type;

forming first and second insulating layers adjacent to each other and over the active area wherein the first insulating layer has a smaller capacitance per unit area than the second insulating layer;

forming a gate conductor over the first insulating layer and over the second insulating layer;

removing first, second, and third portions of the gate conductor, wherein the first portion of the gate conductor overlies the second insulating layer and a first region in the active area, the second portion of the gate conductor overlies the second insulating layer and a second region in the active area, and the third portion of the gate conductor overlies the first insulating layer and a third region in the active area;

doping the third region to a higher concentration of the first conductivity type;

doping the first and second regions to a second conductivity type; and forming contacts to the first, second, and third regions.

11. The method of claim 10, wherein forming the first and second insulating layers comprises:

differentially doping the first and second regions in the active area under the first and second insulating layers; and growing oxide over the first doped area to form the first insulating layer and over the second doped area to form the second insulating layer.

12. The method of claim 11, wherein the second doped area is doped with nitrogen.

13. The method of claim 11, wherein the first doped area is doped with an element selected from the group consisting of fluorine and argon.

14. The method of claim 10, wherein forming the first and second insulating layers comprises:

growing the first insulating layer on the top surface to a first thickness;

etching a portion of the first insulating layer to expose a first portion of the top surface; and growing the second insulating layer over the first portion of the top surface to a second thickness that is thinner than the first thickness.

15. The method of claim 14, wherein the first and second insulating layers comprise silicon oxide.

16. The method of claim 10, wherein the first insulating layer comprises a first material having a first dielectric constant and the second insulating layer comprises a second material having a second dielectric constant, wherein the second dielectric constant is greater than the first dielectric constant.

17. The method of claim 10, wherein the substrate further comprises a second active area, wherein:

doping the active area further comprises doping the second active area to the first conductivity type;

forming the first and second insulating layers further comprises forming the first insulating layer over the second active area;

removing further comprises removing a fourth portion and a fifth portion of the of the gate conductor and leaving a sixth portion of the gate conductor, wherein the fourth portion of the gate conductor overlies a fourth region, said fourth region in the second active area, wherein the fifth portion of the gate conductor overlies a fifth region, said fifth region in the second active area, and wherein the sixth portion is between the fourth and fifth regions, overlies a sixth region, and is separated from the sixth region by the first insulating layer, said sixth region in the second active area;

doping the first and second regions further comprises doping the fourth and fifth regions to the second conductivity type using the sixth portion as a mask; and forming contacts further comprises forming contacts to the fourth and fifth regions.

18. A method of making a semiconductor device, comprising:

providing a substrate having a semiconductor layer and an insulating layer, wherein the semiconductor layer overlies the insulating layer and comprises an active area;

doping the active area;

forming a first gate insulating layer on the active area;

etching a portion of the first gate insulating layer to expose a first portion of the active area;

forming a second gate insulating over the first portion of the active area, wherein the second gate insulating layer is thinner than the first gate insulating layer;

forming a gate electrode layer over the first gate insulating layer and over the second gate insulating layer;

removing portions of the gate electrode layer to expose a portion of the active area and to form a gate electrode over portions of the first gate insulating layer and portions of the second gate insulating layer;

doping portions of the exposed portions of the active area to form source and drain regions; and forming contacts to the source and drain regions.

\* \* \* \* \*

UNITED STATES PATENT AND TRADEMARK OFFICE
CERTIFICATE OF CORRECTION

PATENT NO. : 6,620,656 B2
DATED : September 16, 2003
INVENTOR(S) : Min et al.

It is certified that error appears in the above-identified patent and that said Letters Patent is hereby corrected as shown below:

Column 9,
Line 53, change "insulating" to -- insulating layer --

Column 11,
Line 5, change "of the of the" to -- of the --

Column 12,
Line 8, change "insulating" to -- insulating layer --

Signed and Sealed this

Twenty-seventh Day of January, 2004

JON W. DUDAS
*Acting Director of the United States Patent and Trademark Office*